(12) United States Patent
Li

(10) Patent No.: US 10,347,696 B2
(45) Date of Patent: Jul. 9, 2019

(54) OLED DISPLAY DEVICE, MANUFACTURING METHOD THEREOF AND OLED DISPLAY

(71) Applicant: Shenzhen China Star Optoelectronics Technology Co., Ltd., Shenzhen, Guangdong (CN)

(72) Inventor: Xianjie Li, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 128 days.

(21) Appl. No.: 15/520,335

(22) PCT Filed: Apr. 5, 2017

(86) PCT No.: PCT/CN2017/079438
§ 371 (c)(1),
(2) Date: Apr. 19, 2017

(87) PCT Pub. No.: WO2018/152934
PCT Pub. Date: Aug. 30, 2018

(65) Prior Publication Data
US 2018/0301513 A1 Oct. 18, 2018

(30) Foreign Application Priority Data
Feb. 24, 2017 (CN) .......................... 2017 1 0103094

(51) Int. Cl.
*H01L 27/32* (2006.01)
*H01L 51/50* (2006.01)
(Continued)

(52) U.S. Cl.
CPC .............. *H01L 27/322* (2013.01); *G02B 5/20* (2013.01); *H01L 51/5036* (2013.01);
(Continued)

(58) Field of Classification Search
CPC .............. H01L 27/322; H01L 27/3258; H01L 27/3262; H01L 27/3248
See application file for complete search history.

(56) References Cited

U.S. PATENT DOCUMENTS

| 6,121,726 A | 9/2000 | Codama et al. |
| 2004/0164672 A1* | 8/2004 | Kawaguchi ............ G02B 5/201 |
| | | 313/506 |

(Continued)

FOREIGN PATENT DOCUMENTS

| CN | 1753581 A | 3/2006 |
| CN | 102916138 A | 2/2013 |

(Continued)

*Primary Examiner* — Phuc T Dang
(74) *Attorney, Agent, or Firm* — Andrew C. Cheng

(57) ABSTRACT

The present disclosure proposes an OLED display device, a manufacturing method thereof and an OLED Display. The OLED display device includes a substrate and a color conversion layer and a blue-green light emitting layer disposed in a stack on the substrate. The color conversion layer includes blue filter units, green conversion units and red conversion units disposed apart from one another. Both the green conversion units and the red conversion units are film layers made of an organic metal halide perovskite material. The green conversion units and the red conversion units respectively absorb blue-green light emitted from the blue-green light emitting layer, and convert the blue-green light into green light and red light, the blue filter units filter the blue-green light to obtain blue light so as to achieve color display.

17 Claims, 3 Drawing Sheets

(51) Int. Cl.
  *H01L 51/56* (2006.01)
  *G02B 5/20* (2006.01)
  *H01L 51/00* (2006.01)

(52) U.S. Cl.
  CPC .......... *H01L 51/56* (2013.01); *H01L 51/0077* (2013.01); *H01L 2251/5369* (2013.01); *H01L 2251/5376* (2013.01); *H01L 2251/558* (2013.01)

(56) References Cited

U.S. PATENT DOCUMENTS

| | | |
|---|---|---|
| 2006/0158077 A1 | 7/2006 | Yokoyama et al. |
| 2012/0217867 A1* | 8/2012 | Nagai ................. G02B 5/201 313/504 |
| 2016/0027848 A1* | 1/2016 | Liu ..................... H01L 51/502 257/40 |
| 2016/0141535 A1 | 5/2016 | Snaith et al. |
| 2016/0268347 A1* | 9/2016 | Yan .................... H01L 51/5012 |
| 2017/0018369 A1* | 1/2017 | Nakamura ........... H01G 9/2031 |
| 2017/0331013 A1 | 11/2017 | Lee |

FOREIGN PATENT DOCUMENTS

| | | |
|---|---|---|
| CN | 105870287 A | 8/2016 |
| CN | 105938845 A | 9/2016 |
| CN | 106410049 A | 2/2017 |

\* cited by examiner

OLED DISPLAY DEVICE, MANUFACTURING METHOD THEREOF AND OLED DISPLAY

BACKGROUND OF THE INVENTION

1. Field of the Invention

The present invention relates to an organic light emitting diode (OLED) technology, more particularly, to an OLED display device, a manufacturing method thereof and an OLED display.

2. Description of the Related Art

OLED displays are characterized by self-luminousness, simple structure, lightness, fast response speed, wide view angle, low power consumption, being able to achieve flexible display, and the like, and are therefore known as the "dream display". Because of their many advantages, OLED displays have won the major manufacturers' favor, and become the third-generation display after the cathode ray tube (CRT) displays and liquid crystal displays LCDs).

An OLED display device is used for showing by an OLED display and is one of its important components. The color display of the OLED display device has a very obvious effect on the display quality of the OLED display. In the prior art, the color display of the OLED display device is mainly achieved through the following two methods. One method is manufacturing the OLED display device having three types of sub-pixels, that is, red sub-pixels, green sub-pixels, and blue sub-pixels, through using a fine metal mask (FMM). However, since this method is limited by the FMM, the resolution thus obtained can not be increased and can not satisfy the demand of high resolution. In addition, the other method is to achieve color display through using white light and RGB filters. This method does not need mask alignment, in other words, is not limited by the FMM, but the color saturation thus obtained is lower and the color gamut is not wide enough. Currently, the color gamut of the OLED displays manufactured by using white light and RGB filters is only 86% of the standard color gamut of the (U.S.) National Television Standards Committee.

SUMMARY OF THE INVENTION

The present invention provides an OLED display device, a manufacturing method thereof and an OLED display. The OLED display device according to the present invention can increase its saturation and color gamut of color display.

In order to resolve the above technical problem, the present invention provides a manufacturing method of an OLED display device. The manufacturing method comprises:

using a wet-forming method to form a color conversion layer on a substrate, forming a thin film transistor array, an anode, a hole injection layer, a hole transport layer, a blue-green light emitting layer, an electron transport layer, an electron injection layer and a cathode sequentially on the color conversion layer;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display.

The present invention further provides an OLED display device. The OLED display device comprises:

a substrate, and a color conversion layer and a blue-green light emitting layer disposed in a stack on the substrate;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display.

The present invention further provides an organic light emitting diode (OLED) display comprising an OLED display device and a driver coupled to the OLED display device to feed a driving signal and a control signal to the OLED display device. The OLED display device comprises:

a substrate, and a color conversion layer and a blue-green light emitting layer disposed in a stack on the substrate;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display.

Advantages: as compared with the prior art, the OLED display device according to the present invention comprises a substrate and a color conversion layer and a blue-green light emitting layer disposed in a stack on the substrate. The color conversion layer comprises blue filter units, green conversion units and red conversion units disposed apart from one another. Both the red conversion units and the green conversion units are film layers made of an organic metal halide perovskite material. Since a material of the red conversion units and the green conversion units is the organic metal halide perovskite material that has a high photoluminescence efficiency, the red conversion units and the green conversion units respectively absorb blue-green light emitted from the blue-green light emitting layer, and convert the blue-green light into high saturation red light and high saturation green light. The blue filter units filter the blue-green light to obtain blue light so that the color conversion layer can output color light having high saturation to achieve color display and increase the saturation and color gamut of color display.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

To enable those skilled in the art to better understand the technical solutions of the present invention, the OLED display device, manufacturing method thereof and OLED display provided by the present invention will be further described in detail below in conjunction with the accompanying drawings and the specific implementations. Wherever possible, the same reference numbers will be used throughout the specification and drawings to refer to the same or like structures or areas.

Figure 1:
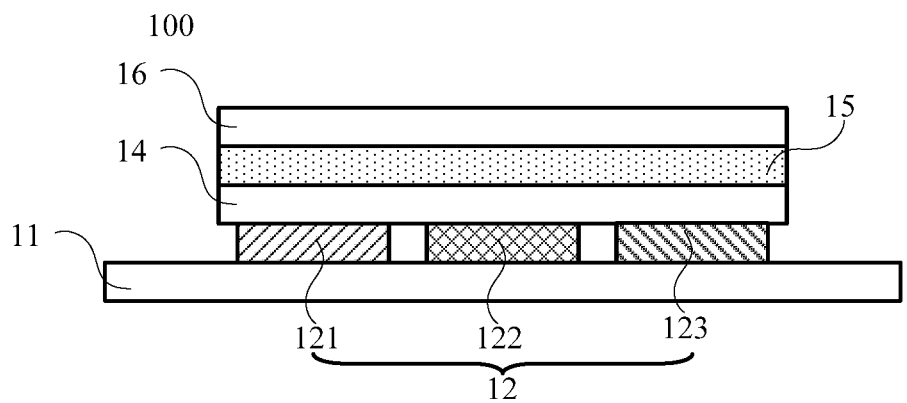
FIG. 1 is a schematic diagram of a structure of an OLED display device according to a first embodiment of the present invention.

Refer to FIG. 1, FIG. 1 is a schematic diagram of a structure of an OLED display device according to a first embodiment of the present invention. An OLED display device 100 comprises a substrate 11, and a color conversion layer 12 and a blue-green light emitting layer 15 disposed in a stack on the substrate 11. The color conversion layer 12 comprises red conversion units 121, green conversion units 122 and blue filter units 123 disposed apart from one another. Both the red conversion units 121 and the green conversion units 122 are film layers made of an organic metal halide perovskite material. It is understood that a structure between the color conversion layer 12 and the blue-green light emitting layer 15 is simplified as a first structure 14, and a structure on the blue-green light emitting layer 15 is simplified as a second structure 16.

The organic metal halide perovskite material used for manufacturing the red conversion units 121 and the green conversion units 122 is a kind of semiconductor material having photoelectric properties. The organic metal halide perovskite material has a low bulk trap density and a high photoluminescence efficiency, and an adjustable light emitting wavelength can be achieved by changing a composition of the organic metal halide perovskite material. At the same time, this kind of material has the photoelectric characteristics of the inorganic semiconductor and the low-temperature film forming characteristic of the organic material.

According to the present embodiment, the blue-green light emitting layer 15 is utilized to emit blue-green light having higher saturation. The red conversion units 121 and the green conversion units 122 respectively absorb the blue-green light emitted from the blue-green light emitting layer 15, and then convert the blue-green light into red light and green light. The blue filter units 123 perform a green light treatment on the blue-green light to emit blue light correspondingly. The red conversion unit 121, the green conversion unit 122 and the blue filter unit 123 correspond to a pixel. The pixel comprises a red sub-pixel, a green sub-pixel and a blue sub-pixel. The red conversion unit 121 corresponds to the red sub-pixel. The green conversion unit 122 corresponds to the green sub-pixel. The blue filter unit 123 corresponds to the blue sub-pixel. Each of the red sub-pixel, the green sub-pixel and the blue sub-pixel corresponds to a thin film transistor (TFT) to respectively control the red conversion unit 121, the green conversion unit 122 and the blue filter unit 123 to which sub-pixels correspond so as to display light of three primary colors. As a result, color display is achieved.

Figure 2:
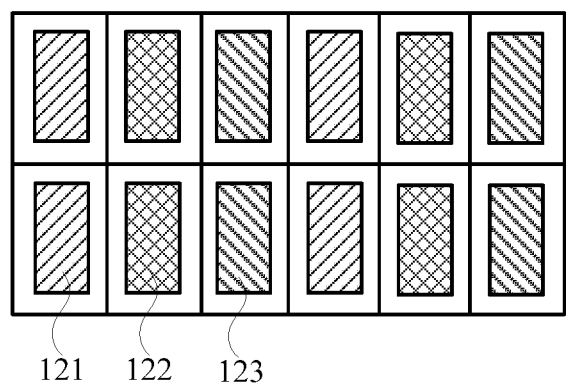
FIG. 2 is a schematic diagram of an arrangement of the color conversion layer in the OLED display device shown in FIG. 1.

Refer to FIG. 2, FIG. 2 is a schematic diagram of an arrangement of the color conversion layer 12 in the OLED display device 100 shown in FIG. 1. Each two adjacent rows of the red conversion units 121, the green conversion units 122 and the blue filter units 123 in the color conversion layer 12 are arranged in a same manner. The red conversion units 121, the green conversion units 122 and the blue filter units 123 in each row are disposed in a horizontal direction from left to right and are sequentially disposed and apart from one another.

According to the present invention, since both the red conversion unit and the green conversion unit absorb the blue-green light emitted from the same blue-green light emitting layer and then convert the blue-green light correspondingly, there is no need to use the FMM to fabricate sub-pixels of three primary colors. That is, the OLED display device is not limited by the FMM so its resolution can be increased depending on needs. Additionally, the manufacturing process is simple, which in turn reduces the manufacturing cost of the OLED display device. In addition to that, since the red conversion unit and the green conversion unit absorb the blue-green light and the wavelength of the blue-green light thus absorbed is adjusted through the organic metal halide perovskite material, which is different from the method in which RGB filters are utilized to filter white light to obtain the red, green and blue light, the degree of saturation of emergent light is not reduced. Hence, not only can the OLED display device according to the present embodiment satisfy the resolution demand, but it can also increase the saturation and color gamut of color display. Based on the properties of organic metal halide perovskite material, the resulting OLED display device has a thinner device thickness and can be applied to large-sized OLED displays.

In greater detail, the organic metal halide perovskite material used for manufacturing the red conversion units 121 and the green conversion units 122 may be a single organic metal halide perovskite material, or may be a mixed material comprising a plurality of organic metal halide perovskite materials. In greater detail, the structural formula of the organic metal halide perovskite material is $CH_3NH_3PbA_3$, in which A is at least one element selected from the group consisting of chlorine, bromine and iodine.

The blue filter units 123 are film layers formed by using a quantum dot material or an organic material commonly used in LCDs.

The red conversion units 121, the green conversion units 122 and the blue filter units 123 all can be fabricated by using a wet-forming method to form film layers on the substrate correspondingly. A thickness of the film layer of each of the red conversion unit 121, the green conversion unit 122 and the blue filter unit 123 is between 10 nanometers and 200 nanometers. A thickness of the red conversion unit 121, a thickness of the green conversion unit 122, and a thickness of the blue filter unit 123 are the same.

The blue-green light emitting layer 15 comprises an organic host material and a blue-green light emitting organic guest material. That is, the organic host material and the blue-green light emitting organic guest material are doped at a certain mass ratio. Through changing a doping ratio of the blue-green light emitting organic guest material, the blue-green light emitting layer 15 is able to emit high brightness and high saturation blue-green light.

In greater detail, the blue-green light emitting organic guest material of the blue-green light emitting layer 15 may be an organic fluorescent material or an organic phosphorescent material, and the organic host material may be an anthracene derivative or a wide bandgap organic material. A doping mass ratio of the organic host material to the blue-green light emitting organic guest material in the blue-green light emitting layer 15 will affect the luminous efficiency of the blue-green light emitting layer 15 and the saturation of blue-green light. Selectively, the doping mass ratio of the organic host material to the blue-green light emitting organic guest material is 1:0.01-1:1. The greater the doping mass ratio of the blue-green light emitting organic guest material in the blue-green light emitting layer 15 is, the more the saturation of the blue-green light emitted from the blue-green light emitting layer 15 is increased. In addition, the blue-green light emitting organic guest material may be a single blue-green light emitting material, or may be a mixed material of a blue light emitting material and a green light emitting material.

Figure 3:
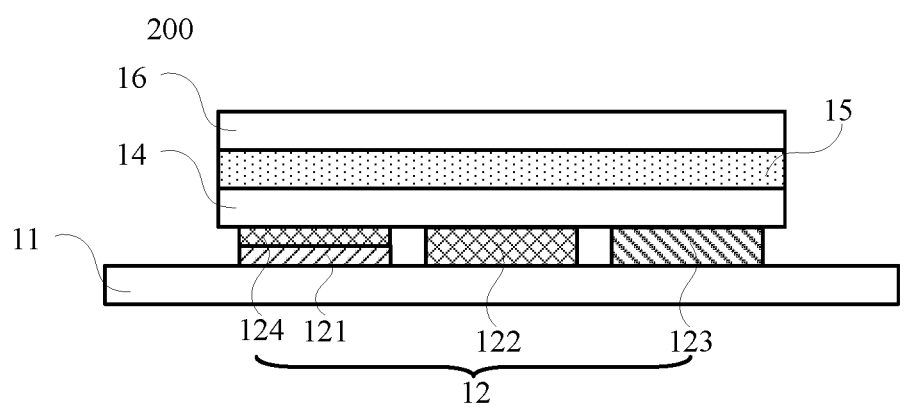
FIG. 3 is a schematic diagram of a structure of an OLED display device according to a second embodiment of the present invention.

Refer to FIG. 3, FIG. 3 is a schematic diagram of a structure of an OLED display device according to a second embodiment of the present invention. An OLED display device 200 similarly comprises the substrate 11, and the color conversion layer 12 and the blue-green light emitting layer 15 disposed in a stack on the substrate 11.

Since the blue-green light emitting layer 15 according to the present embodiment is the same as the blue-green light emitting layer 15 of the OLED display device 100 shown in FIG. 1, a description in this regard is not provided.

The color conversion layer 12 according to the present embodiment comprises the red conversion units 121, the green conversion units 122 and the blue filter units 123 disposed apart from one another. The color conversion layer 12 further comprises green conversion sub-units 124 on the red conversion units 121. All the red conversion units 121, the green conversion units 122 and the green conversion sub-units 124 are film layers made of an organic metal halide perovskite material.

In the present embodiment, the green conversion sub-units 124 on the red conversion units 121 absorb blue-green light emitted from the blue-green light emitting layer 15, and then convert the blue-green light into green light. The green light then passes the red conversion units 121 to allow the red conversion units 121 to emit red light. The green conversion units 122 absorb the blue-green light emitted from the blue-green light emitting layer 15, and then convert the blue-green light into green light. The blue filter units 123 filter the blue-green light emitted from the blue-green light emitting layer 15 to obtain blue light. As a result, the OLED display device achieves color display.

An arrangement of the red conversion units 121, the green conversion units 122 and the blue filter units 123 is the same as the arrangement shown in FIG. 3.

According to the present embodiment, the red conversion units 121, the green conversion units 122 and the green conversion sub-units 124 all can be fabricated by using a wet-forming method to form film layers correspondingly. A thickness of the green conversion unit 122 may be between 10 nanometers and 200 nanometers. The red conversion unit 121 and the green conversion sub-unit 124 are disposed in a stack, and a sum of thicknesses of the red conversion unit 121 and the green conversion sub-unit 124 is the same as the thickness of the green conversion unit 122. The blue filter units 123 similarly can be fabricated by using a wet-forming method to form film layers correspondingly. A thickness of the blue filter unit 123 is the same as the thickness of the green conversion unit 122, which is also between 10 nanometers and 200 nanometers.

Figure 4:
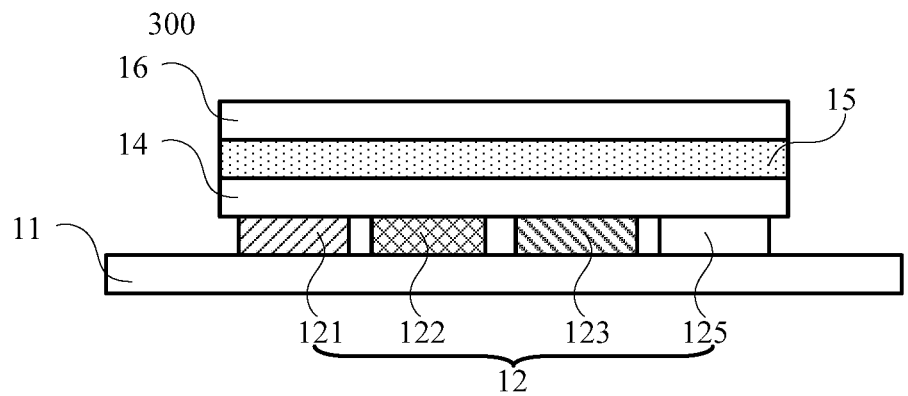
FIG. 4 is a schematic diagram of a structure of an OLED display device according to a third embodiment of the present invention.

FIG. 4 is a schematic diagram of a structure of an OLED display device according to a third embodiment of the present invention. The present embodiment is obtained by making improvements to the OLED display device 100 according to the first embodiment shown in FIG. 1. An OLED display device 300 according to the present embodiment comprises the substrate 11, and the color conversion layer 12 and the blue-green light emitting layer 15 disposed in a stack on the substrate 11. The color conversion layer 12 comprises the red conversion units 121, the green conversion units 122 and the blue filter units 123 disposed apart from one another. In addition, the color conversion layer 12 further comprises white conversion units 125.

In the present embodiments, since structures of the blue-green light emitting layer 15, the red conversion units 121, the green conversion units 122 and the blue filter units 123 are respectively the same as structures shown in the first embodiment of the OLED display device of FIG. 1, a description in this regard is not provided. A difference lies in that each of the white conversion units 125 is disposed adjacent to the red conversion unit 121, the green conversion unit 122 or the blue filter unit 123.

Figure 5A:
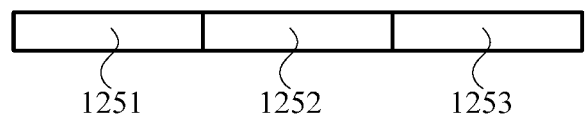
FIG. 5a is a schematic diagram of a structure of the white conversion unit in the OLED display device shown in FIG. 4 according to a first embodiment of the present invention.

As shown in FIG. 5a, the white conversion unit 125 comprises an opening sub-unit 1251 and a red conversion sub-unit 2152 disposed adjacent to each other. In greater detail, the opening sub-unit 1251 and the red conversion sub-unit 1252 in the white conversion unit 125 are closely connected without a gap. The red conversion sub-unit 1252 absorbs blue-green light emitted from the blue-green light emitting layer 15, and then converts the blue-green light into red light. The opening sub-unit 1251 transmits the blue-green light emitted from the blue-green light emitting layer 15. The opening sub-unit 1251 and the red conversion sub-unit 1252 simultaneously operate to convert the blue-green light emitted from the blue-green light emitting layer 15 into white light, thereby improving the luminance of the OLED display device so as to improve display quality.

Figure 5B:
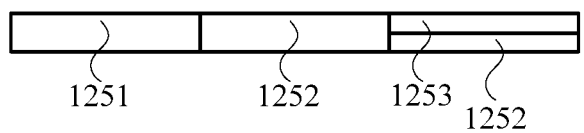
FIG. 5b is a schematic diagram of a structure of the white conversion unit in the OLED display device shown in FIG. 4 according to a second embodiment of the present invention.

Additionally, as shown in FIG. 5b, the white conversion unit 125 further comprises a green conversion sub-unit 1253 on the red conversion sub-unit 1252. The green conversion sub-unit 1253 absorbs blue-green light emitted from the blue-green light emitting layer 15, and then converts the blue-green light into green light, and then converts the green light into red light through the red conversion sub-unit 1252. Similarly, the blue-green light emitted from the blue-green light emitting layer 15 can be converted into white light, thereby improving the luminance of the OLED display device so as to improve display quality.

Figure 6:
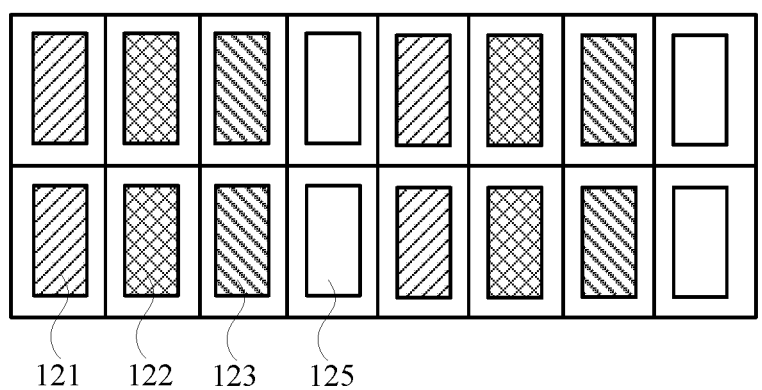
FIG. 6 is a schematic diagram of an arrangement of the color conversion layer in the OLED display device shown in FIG. 4 according to one embodiment.
Figure 7:
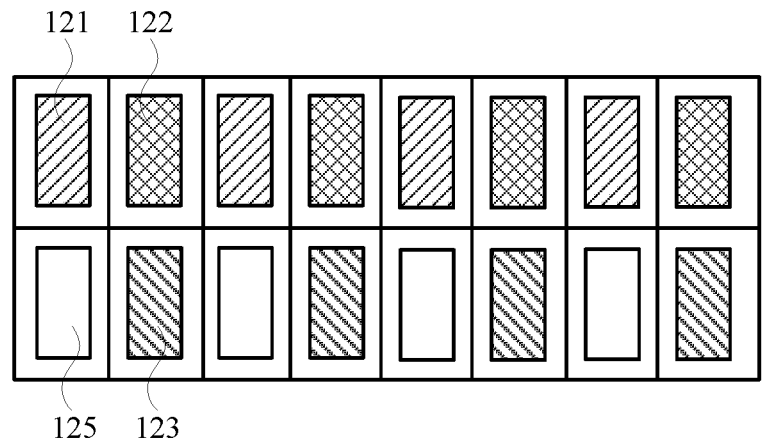
FIG. 7 is a schematic diagram of an arrangement of the color conversion layer in the OLED display device shown in FIG. 4 according to another embodiment.

According to the third embodiment of the OLED display device, the red conversion unit, the green conversion unit, the blue filter unit and the white conversion unit correspond to a pixel. Refer to FIG. 6, FIG. 6 is a schematic diagram of an arrangement of the color conversion layer 12 in the OLED display device 300 shown in FIG. 4. As shown in FIG. 6, each two adjacent rows of the red conversion units 121, the green conversion units 122, the blue filter units 123 and the white conversion units 125 in the color conversion layer 12 are arranged in a same manner. The red conversion units 121, the green conversion units 122, the blue filter units 123 and the white conversion units 125 in each row are disposed in a horizontal direction from left to right and are sequentially disposed and apart from one another. In addition to that, refer to FIG. 7, the red conversion units 121, the green conversion units 122, the blue filter units 123 and the white conversion units 125 may be arranged in an array according to the present embodiment. That is, the red conversion unit 121, the green conversion unit 122, the blue filter unit 123 and the white conversion unit 125 are disposed in the clockwise direction and are sequentially disposed and apart from one another. Additionally, the red conversion unit 121, the green conversion unit 122, the blue filter unit 123 and the white conversion unit 125 may be disposed in the counterclockwise direction and are sequentially disposed and apart from one another.

The display effect of the present invention OLED display device and the arrangement relationships between the various conversion units in the color conversion layer may be applied to OLED display devices having different pixel arrangements.

Figure 8:
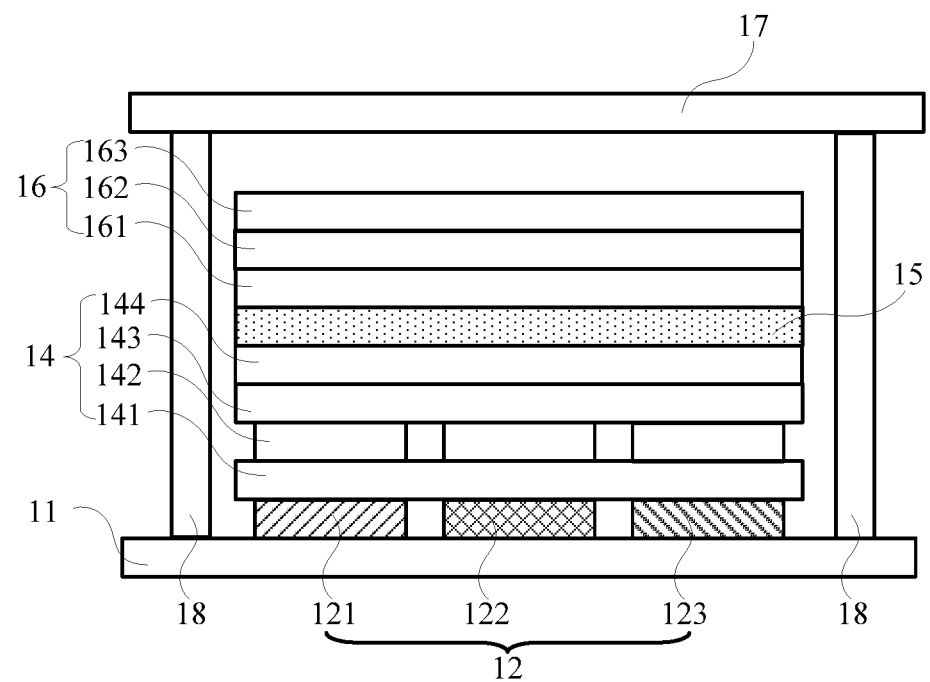
FIG. 8 is a schematic diagram of a structure of an application example of an OLED display device according to the present invention.

Refer to FIG. 8, FIG. 8 is a schematic diagram of a structure of an application example of an OLED display device according to the present invention. In the present embodiment, the first structure 14 comprises a thin film transistor array 141, an anode 142, a hole injection layer 143 and a hole transport layer 144 sequentially disposed in a stack. The second structure 16 comprises an electron transport layer 161, an electron injection layer 162 and a cathode 163 sequentially disposed in a stack.

In greater detail, the substrate 11 may be a transparent material, such as a glass plate or plastic, etc.

The thin film transistor array 141 comprises a semiconductor layer, an insulating layer, a source, a drain, and a gate.

The anode 142 is a transparent conductive metal oxide, such as an indium tin oxide (ITO) conductive thin film or an indium zinc oxide (IZO) conductive thin film. A film thickness of the anode 142 may be 20 nanometers.

The hole injection layer 143 may be an organic small molecule hole injecting material, a polymer hole injecting material, or a metal oxide hole injecting material. A film thickness of the hole injection layer 143 is between 1 nanometer and 100 nanometers.

The hole transport layer 144 may be an organic small molecule hole transport material or a polymer hole transport material. A film thickness of the hole transport layer 144 is between 10 nm and 100 nm.

The electron transport layer 161 may be a metal complex material or an imidazole electron transport material. A film thickness of the electron transport layer 161 is between 10 nanometers and 100 nanometers.

The electron injection layer 162 may be a metal complex or an alkaline earth metal and a salt thereof. A film thickness of the electron injection layer 162 is between 0.5 nanometers and 10 nanometers.

A material of the cathode 163 is a low work function metallic material, such as metallic materials like lithium, magnesium, calcium, strontium, lanthanum, cerium, europium, ytterbium, aluminum, cesium, rubidium, silver, etc., or alloys thereof. The low work function metallic material may be used by itself, or two or more of them may be used in combination. A film thickness of the cathode 163 is between 10 nanometers and 1000 nanometers.

All the thin film transistor array 141, the anode 142, the hole injection layer 143, the hole transport layer 144, the electron transport layer 161, the electron injection layer 162 and the cathode 163 may be fabricated by using sputtering, vacuum deposition, or the like, to form film layers correspondingly.

As shown in FIG. 8, the OLED display device further comprises a package structure, and the package structure according to the present embodiment comprises a cover plate 17 and an encapsulation material 18. The cover plate 17 is over the cathode 163, and the encapsulation material 18 is around the OLED display element. The OLED display element is encapsulated through using the encapsulation material 18 and the cover plate 17. The cover plate 17 is a glass cover or a cover made of a flexible material. The encapsulation material 18 is an epoxy resin or an ultraviolet curing adhesive.

It is understood that the package structure of the OLED display device according to the present embodiment is only an application example and is not intended to limit the package structure of the OLED display device. The package structure of the OLED display device may further be a package structure formed by alternately superimposing barrier layers and buffer layers or some other package structure.

The present invention further provides an OLED display. An OLED display device in the OLED display may be any of the OLED display devices shown in FIG. 1, FIG. 3, and FIG. 4, and a description in this regard is not provided.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A manufacturing method of an organic light emitting diode (OLED) display device comprising:

using a wet-forming method to form a color conversion layer on a substrate, forming a thin film transistor array, an anode, a hole injection layer, a hole transport layer, a blue-green light emitting layer, an electron transport layer, an electron injection layer and a cathode sequentially on the color conversion layer;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display;

the organic metal halide perovskite material is a single organic metal halide perovskite material or a mixed material comprising a plurality of organic metal halide perovskite materials;

a structural formula of the organic metal halide perovskite material is $CH_3NH_3PbA_3$, wherein A is at least one element selected from the group consisting of chlorine, bromine and iodine.

2. The manufacturing method as claimed in claim 1, wherein a thickness of each of the film layers is between 10 nanometers and 200 nanometers.

3. The manufacturing method as claimed in claim 1, wherein the blue-green light emitting layer comprises an organic host material and a blue-green light emitting organic guest material, a ratio of the organic host material to the blue-green light emitting organic guest material is 1:0.01-1:1;

wherein the blue-green light emitting organic guest material is an organic fluorescent material or an organic phosphorescent material, the organic host material is an anthracene derivative or a wide bandgap organic material.

4. An organic light emitting diode (OLED) display device comprising:

a substrate, and a color conversion layer and a blue-green light emitting layer disposed in a stack on the substrate;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display;

the organic metal halide perovskite material is a single organic metal halide perovskite material or a mixed material comprising a plurality of organic metal halide perovskite materials;

a structural formula of the organic metal halide perovskite material is $CH_3NH_3PbA_3$, wherein A is at least one element selected from the group consisting of chlorine, bromine and iodine.

5. The OLED display device as claimed in claim 4, further comprising a thin film transistor array, an anode, a hole injection layer and a hole transport layer sequentially disposed in a stack between the color conversion layer and the blue-green light emitting layer, and an electron transport layer, an electron injection layer and a cathode sequentially disposed in a stack on the blue-green light emitting layer.

6. The OLED display device as claimed in claim 4, wherein the color conversion layer further comprises white conversion units, each of the white conversion units comprises an opening sub-unit and a red conversion sub-unit disposed in a same layer, the red conversion sub-unit absorbs the blue-green light emitted from the blue-green light emitting layer, and converts the blue-green light into red light, the opening sub-unit transmits the blue-green light so as to convert the blue-green light emitted from the blue-green light emitting layer into white light.

7. The OLED display device as claimed in claim 6, wherein the blue filter units, the green conversion units, the red conversion units and the white conversion units in the color conversion layer are arranged sequentially or arranged in an array.

8. The OLED display device as claimed in claim 4, wherein a green conversion sub-unit is disposed on the red conversion unit.

9. The OLED display device as claimed in claim 4, wherein a thickness of each of the film layers is between 10 nanometers and 200 nanometers.

10. The OLED display device as claimed in claim 4, wherein the blue-green light emitting layer comprises an organic host material and a blue-green light emitting organic guest material, a ratio of the organic host material to the blue-green light emitting organic guest material is 1:0.01-1:1;

wherein the blue-green light emitting organic guest material is an organic fluorescent material or an organic phosphorescent material, the organic host material is an anthracene derivative or a wide bandgap organic material.

11. The OLED display device as claimed in claim 10, wherein the blue-green light emitting organic guest material is a single blue-green light emitting material or a mixed material of a blue light emitting material and a green light emitting material.

12. An organic light emitting diode (OLED) display, comprising an OLED display device and a driver coupled to the OLED display device to feed a driving signal and a control signal to the OLED display device, the OLED display device comprising:

a substrate, and a color conversion layer and a blue-green light emitting layer disposed in a stack on the substrate;

wherein the color conversion layer comprises blue filter units, green conversion units and red conversion units disposed apart from one another, both the green conversion units and the red conversion units are film layers made of an organic metal halide perovskite material;

the green conversion units and the red conversion units respectively absorb blue-green light emitted from the blue-green light emitting layer, and convert the blue-green light into green light and red light, the blue filter units filter the blue-green light to obtain blue light so as to achieve color display;

the organic metal halide perovskite material is a single organic metal halide perovskite material or a mixed material comprising a plurality of organic metal halide perovskite materials;

a structural formula of the organic metal halide perovskite material is $CH_3NH_3PbA_3$, wherein A is at least one element selected from the group consisting of chlorine, bromine and iodine.

13. The OLED display as claimed in claim 12, wherein the OLED display device further comprises a thin film transistor array, an anode, a hole injection layer and a hole transport layer sequentially disposed in a stack between the color conversion layer and the blue-green light emitting layer, and an electron transport layer, an electron injection layer and a cathode sequentially disposed in a stack on the blue-green light emitting layer.

14. The OLED display as claimed in claim 12, wherein the color conversion layer further comprises white conversion units, each of the white conversion units comprises an opening sub-unit and a red conversion sub-unit disposed in a same layer, the red conversion sub-unit absorbs the blue-green light emitted from the blue-green light emitting layer, and converts the blue-green light into red light, the opening sub-unit transmits the blue-green light so as to convert the blue-green light emitted from the blue-green light emitting layer into white light.

15. The OLED display as claimed in claim 14, wherein the blue filter units, the green conversion units, the red conversion units and the white conversion units in the color conversion layer are arranged sequentially or arranged in an array.

16. The OLED display as claimed in claim 12, wherein a green conversion sub-unit is disposed on the red conversion unit.

17. The OLED display as claimed in claim 12, wherein a thickness of each of the film layers is between 10 nanometers and 200 nanometers.

\* \* \* \* \*